(12) United States Patent
Tsai et al.

(10) Patent No.: US 8,585,390 B2
(45) Date of Patent: Nov. 19, 2013

(54) MOLD MAKING SYSTEM AND MOLD MAKING METHOD

(75) Inventors: Hung-Yin Tsai, Hsinchu County (TW); Tien-Li Chang, Taipei (TW); Shao-Wei Luo, Taipei (TW)

(73) Assignee: National Tsing Hua University, Hsinchu (TW)

( * ) Notice: Subject to any disclaimer, the term of this patent is extended or adjusted under 35 U.S.C. 154(b) by 532 days.

(21) Appl. No.: 12/914,240

(22) Filed: Oct. 28, 2010

(65) Prior Publication Data
US 2012/0007285 A1    Jan. 12, 2012

(30) Foreign Application Priority Data
Jul. 6, 2010   (TW) ................................ 99122242 A

(51) Int. Cl.
*B29C 35/08* (2006.01)
(52) U.S. Cl.
USPC .......................................... 425/174; 264/496
(58) Field of Classification Search
USPC .................. 425/174, 174.4; 264/496
See application file for complete search history.

(56) References Cited

U.S. PATENT DOCUMENTS

| | | | | |
|---|---|---|---|---|
| 6,864,034 | B2 * | 3/2005 | Nishida et al. | 430/200 |
| 8,518,633 | B2 * | 8/2013 | Kobrin et al. | 430/321 |
| 2006/0207976 | A1 * | 9/2006 | Bovatsek et al. | 219/121.69 |

* cited by examiner

*Primary Examiner* — Joseph S Del Sole
*Assistant Examiner* — Kimberly A Stewart
(74) *Attorney, Agent, or Firm* — Muncy, Geissler, Olds & Lowe, PLLC

(57) ABSTRACT

A mold making system for surface patterning of a roller mold is provided. The roller mold includes a transparent hollow roller and a polymer layer disposed at an outer surface of the transparent hollow roller. The mold making system includes a laser generation device, an optical path changing device, and a control device connected to the optical path changing device. The laser generation device is used for generating an ultrafast laser. The optical path changing device is disposed at an inner space of the transparent hollow roller to receive the ultrafast laser. The control device controls the optical path changing device to guide the ultrafast laser to pass through the transparent hollow roller and to be focused at a focus position in the polymer layer.

10 Claims, 6 Drawing Sheets ated fields. Compared with the conventional laser, the advantage of the femtosecond laser is that the ultrashort pulse width and instant heating of the femtosecond laser enable the heat after processing to be dissipated right away, so as to avoid the problem of residual thermal stress due to thermal diffusion.

MOLD MAKING SYSTEM AND MOLD MAKING METHOD

CROSS-REFERENCE TO RELATED APPLICATION

This application claims the benefit of Taiwan Patent Application No. 099122242, filed on Jul. 6, 2010, which is hereby incorporated by reference for all purposes as if fully set forth herein.

BACKGROUND OF THE INVENTION

1. Field of Invention

The present invention relates to a mold making system and a mold making method thereof, and more particularly to a mold making system and a mold making method for making a three-dimensional (3D) micro/nanometer structure on a surface of a roller mold.

2. Related Art

The imprint technology is one of the simplest methods in the technologies for duplicating microelectronic element structures. In this technology, a mold is usually pressed in a material, and the material is then shaped by using an ultraviolet light exposure or heat treatment method. Compared with conventional ultraviolet light exposure methods adopted in most microelectronic technologies, the imprint technology not only can duplicate patterns in a plane direction, but also can imprint structures of steps and contour lines in a vertical direction. In a common imprint technology, the roller imprint and plane imprint modes are adopted. In the roller imprint mode, the roller mold rolls on a substrate to transfer patterns on the mold onto the material on the surface of the substrate. In the plane imprint mode, the patterns on the plane mold are directly transferred onto the material on the surface of the substrate by the plane mold in a surface contact mode. Compared with the plane imprint, the roller imprint mode is advantageous in continuous imprint process; therefore, the roller imprint mode takes advantages in a large-area or continuous imprint process, as well as low cost, low equipment cost, low power consumption, and high production capacity.

As discussed above, in view of the importance of the imprint technology for the development of the next generation industry, the improvement of a roller mold having a micro/nanometer pattern is always a focus of all fields. Conventionally, micro/nanometer patterns can be made on a surface of the roller mold through ultra-precision processing, photolithographic processing, and conventional laser processing. However, the conventional modes have respective disadvantages. For example, the precision of the ultra-precision processing is limited by the size of the machining tool, and as the ultra-precision processing is physical contact processing, the tool might be easily deformed. The photolithographic processing is only used for specific substrates, but the sizes of which are limited. In addition, in the conventional laser processing, due to the use of the continuous wave laser or long wavelength laser mode, a large amount of heat energy cannot be dissipated, such that a thermal diffusion phenomenon occurs in the laser focus area, thus residual thermal stress is generated in the substrate.

In the field of ultra-precision manufacturing technology, high precision and high efficiency processing of ultrafast lasers having ultrashort pulses have promising prospect. The ultrafast laser is also referred to as the femtosecond laser. A pulse period of the femtosecond laser is about $5 \times 10^{-15}$ second, so that the femtosecond laser can be widely applied to the biomedical, engineering, and micro-electro-mechanics related fields. Compared with the conventional laser, the advantage of the femtosecond laser is that the ultrashort pulse width and instant heating of the femtosecond laser enable the heat after processing to be dissipated right away, so as to avoid the problem of residual thermal stress due to thermal diffusion.

The femtosecond laser of the near infrared light is highly transmissive for polymer materials, so that the femtosecond laser can pass through photoresist material and be focused in a photoresist material. As the instantaneous light intensity at the focus point is very high, the photoresist material at the focus point can realize nonlinear two-photon absorption which results in photopolymerization reaction. The intensity of the incident femtosecond laser can be suitably controlled to make the light intensity on the optical path insufficient to generate the two-photon absorption effect. Therefore, the photopolymerization reaction only occurs on the photoresist material at the focus point. In the mode above, the femtosecond laser can directly form a microstructure having a specified shape. Compared with the conventional process technology such as lithography etching or electron beam etching, the two-photon absorption mode has the advantages such as mask free, a single step, and a real 3D structure.

Currently, the ultrafast laser or femtosecond laser is used for making a micro/nanometer structure on a surface of a mold only for processing the plane mold, but not for processing the roller mold. In addition to the above thermal diffusion effect in the roller mold, the conventional laser also has difficulties in making verticality and flatness for complicated patterns.

SUMMARY OF THE INVENTION

Therefore, the present invention is directed to a mold making system for making a micro/nanometer 3D structure on a surface of a roller mold by using an ultrafast laser, so as to solve the above-mentioned problems.

According to an embodiment, the mold making system of the present invention is used for patterning a surface of a roller mold, that is, for making patterns on the surface of the roller mold to be applied in an imprint process. The roller mold includes a transparent hollow roller and a polymer layer disposed on an outer surface of the transparent hollow roller.

In this embodiment, the mold making system includes a laser generation device, an optical path changing device, and a control device. The laser generation device is used for generating an ultrafast laser, and the optical path changing device is used for receiving the generated ultrafast laser. The optical path changing device is disposed in an inner space of the transparent hollow roller, and the control device is connected to the optical path changing device. The control device controls the optical path changing device, so that the optical path changing device guides the ultrafast laser to irradiate out from the inner space of the transparent hollow roller, and the optical path changing device focuses the ultrafast laser in the polymer layer.

The present invention is directed to a mold making method for making a micro/nanometer 3D structure on a surface of a roller mold by using an ultrafast laser.

According to an embodiment, the mold making method of the present invention is used for making a micro/nanometer 3D structure on a surface of the roller mold to be applied in an imprint process. The roller mold includes a transparent hollow roller and a polymer layer disposed on an outer surface of the transparent hollow roller.

In this embodiment, the mold making method includes the following steps. First, an ultrafast laser is emitted into an inner space of the transparent hollow roller. Next, the ultrafast laser is received in the inner space. In the end, the ultrafast laser is guided to travel towards the polymer layer of the transparent hollow roller and is focused in the polymer layer.

The advantages and spirits of the present invention can be further understood with reference to the following detailed illustration and the accompanying drawings.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
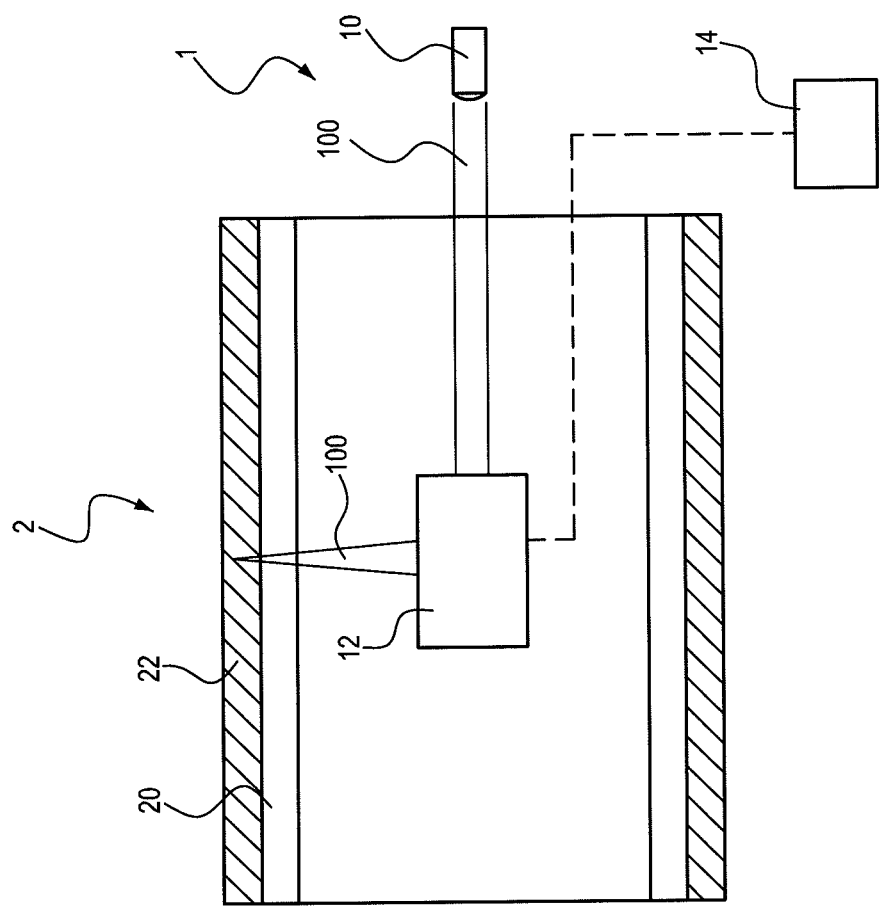
FIG. 1 is a schematic drawing of a mold making system according to an embodiment of the present invention.

FIG. 1 is a schematic drawing of a mold making system 1 according to an embodiment of the present invention. As shown in FIG. 1, the mold making system 1 includes a laser generation device 10, an optical path changing device 12, and a control device 14. The control device 14 is connected to the optical path changing device 12.

The mold making system 1 is used in a roller mold 2 for patterning a surface of the roller mold 2.

In this embodiment, the roller mold 2 includes a transparent hollow roller 20 and a polymer layer 22 disposed on an outer surface of the transparent hollow roller 20. An inner space is formed in the center of the transparent hollow roller 20. The optical path changing device 12 of the mold making system 1 is placed in the inner space.

The laser generation device 10 generates an ultrafast laser 100 (or referred to as a femtosecond laser) to the optical path changing device 12. After receiving the ultrafast laser 100, the optical path changing device 12 guides the ultrafast laser 100 to travel towards the polymer layer 22 on the outer surface of the transparent hollow roller 20 according to control of the control device 14. In addition, the optical path changing device 12 further focuses the ultrafast laser 100 into the polymer layer 22. In practice, the optical path changing device includes a reflector and a focusing mirror. The control device directly controls a reflection angle of the reflector to enable the ultrafast laser to travel towards different angles. Also, the control device directly controls the focusing mirror to focus the ultrafast laser at different positions in the polymer layer. In addition, in practice, the pulse period of the ultrafast laser may be $5 \times 10^{-15}$ second, including but not limited thereto.

As shown in FIG. 1, the ultrafast laser 100 travels from the optical path changing device 12 towards the polymer layer 22 and reaches the transparent hollow roller 20, and then passes through the transparent hollow roller 20 to reach the polymer layer 22. As a near infrared light laser, the ultrafast laser 100 is highly transmissive for the polymer material, so that the ultrafast laser 100 passes through the polymer layer 22. In practice, the material of the polymer layer can be AZ, SU8 or FD, which can be transmitted by the near-infrared femtosecond laser. Under the focusing effect of the optical path changing device 12, the ultrafast laser 100 forms a focus point in the polymer layer 22. As the instantaneous light intensity of the focus point is very high, a two-photon absorption effect occurs on the polymer layer 22 here, so that a photopolymerization reaction occurs on the polymer layer 22 at the focus point.

In practice, the laser generation device 10 is also connected to the control device 14, and the control device 14 controls the laser generation device 10 to emit an ultrafast laser 100. As discussed above, the control device 10 controls the optical path changing device 12, so that the optical path changing device 12 changes a focus position of the ultrafast laser 100 in the polymer layer 22. In this embodiment, the control device 10 controls the optical path changing device 12 to change the focus position according to control information. Therefore, through the change of the focus position, the mold making system 1 scans a contour of a desired micro/nanometer 3D structure on the polymer layer 22, so as to pattern the polymer layer 22. For example, in practice, a desired pattern of the micro/nanometer 3D structure of the roller mold is first sent into an analysis device for external contour analysis or the external contour analysis is directly performed by the control device, and the control device controls the optical path changing device according to a result of the contour analysis, so that the optical path changing device focuses the ultrafast laser onto the polymer layer of the roller mold. Next, the control device controls the optical path changing device according to the result of the contour analysis, so that the focus point of the ultrafast laser performs scanning in the polymer layer along the contour of the desired micro/nanometer 3D structure. In the polymer layer, two-photon absorption occurs at the positions where the focus point of the ultrafast laser performs scanning, thus resulting in the photopolymerization effect, so that the desired micro/nanometer 3D structure is cured in the polymer layer. In the end, other parts of the polymer layer that are not cured are removed, so as to obtain a patterned roller mold that has the micro/nanometer 3D structure.

Figure 2:
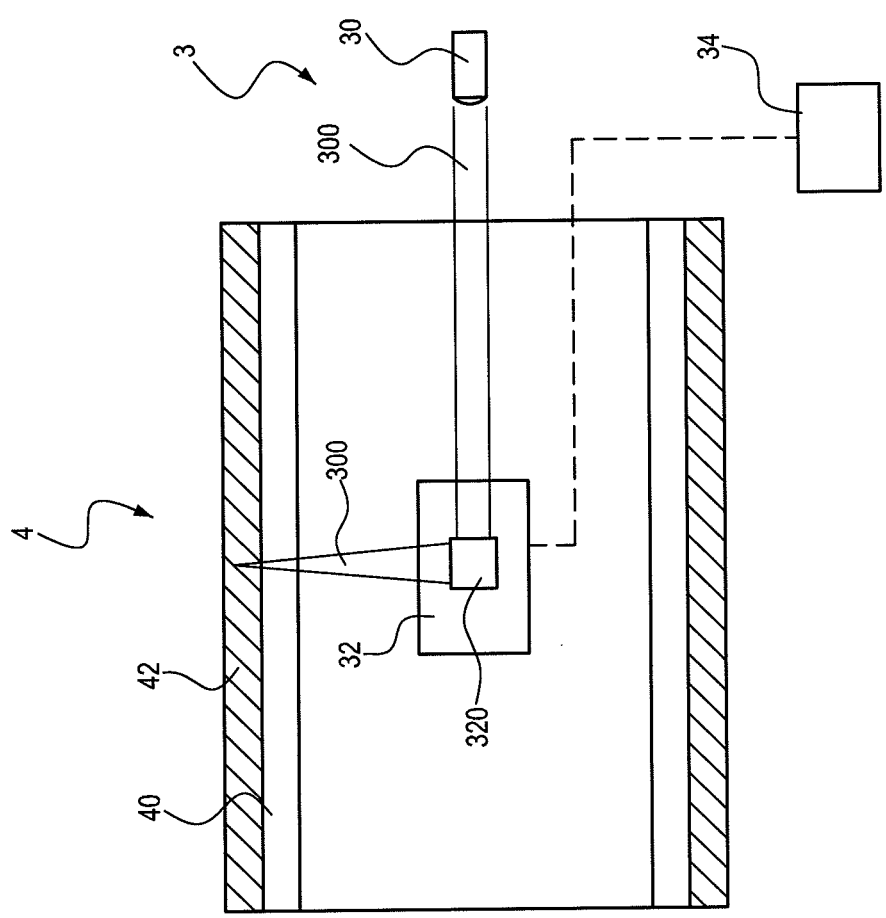
FIG. 2 is a schematic drawing of a mold making system according to another embodiment of the present invention.

FIG. 2 is a schematic drawing of a mold making system 3 according to another embodiment of the present invention. As shown in FIG. 2, the mold making system 3 includes a laser generation device 30, an optical path changing device 32, and a control device 34, and is used in a roller mold 4 for patterning a surface of the roller mold 4. The roller mold 4 includes a transparent hollow roller 40 and a polymer layer 42 disposed on an outer surface of the transparent hollow roller 40. A difference between this embodiment and the previous embodiment lies in that the optical path changing device 32 in this embodiment further includes a waveform shaping device 320. After the optical path changing device 32 receives the ultrafast laser 300 from the laser generation device 30, the waveform shaping device 320 redistributes the energy of the ultrafast laser 300, so that the beam of the ultrafast laser 300 has a leveling effect.

Figure 3A:
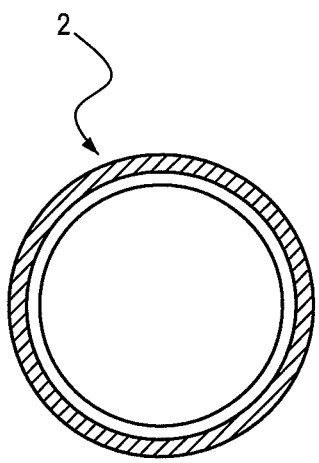
FIG. 3A is a sectional view of a roller mold in FIG. 1 in another angle.
Figure 3B:
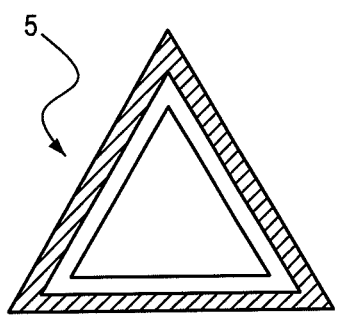
FIGS. 3B and 3C are sectional views of roller molds according to different embodiments of the present invention.
Figure 3C:
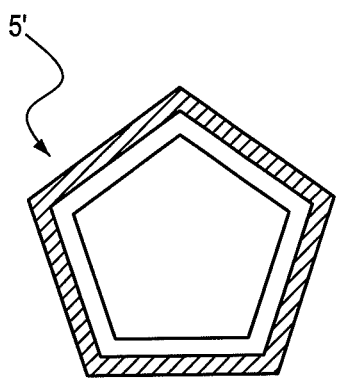

In the embodiments, a shape of the transparent hollow roller is a cylinder, that is, its section is a circle. FIG. 3A is a sectional view of the roller mold 2 in FIG. 1 in another angle. FIGS. 3B and 3C are sectional view of roller molds according to different embodiments of the present invention. As shown in FIG. 3B, according to an embodiment, a shape of a roller mold 5 is a triangular prism, so that its section is a triangle. In addition, as shown in FIG. 3C, according to another embodiment, a shape of a roller mold 5' is a pentagonal prism, so that its section is a pentagon. The surface patterning of the roller molds 5 and 5' in the above embodiments is realized by using the mold making system of the present invention in a mode that the optical path changing device guides the position of the focus point of the ultrafast laser. Therefore, the shape of the roller mode the present invention is determined according to the demands of the users or designers, but not limited to.

Figure 4:
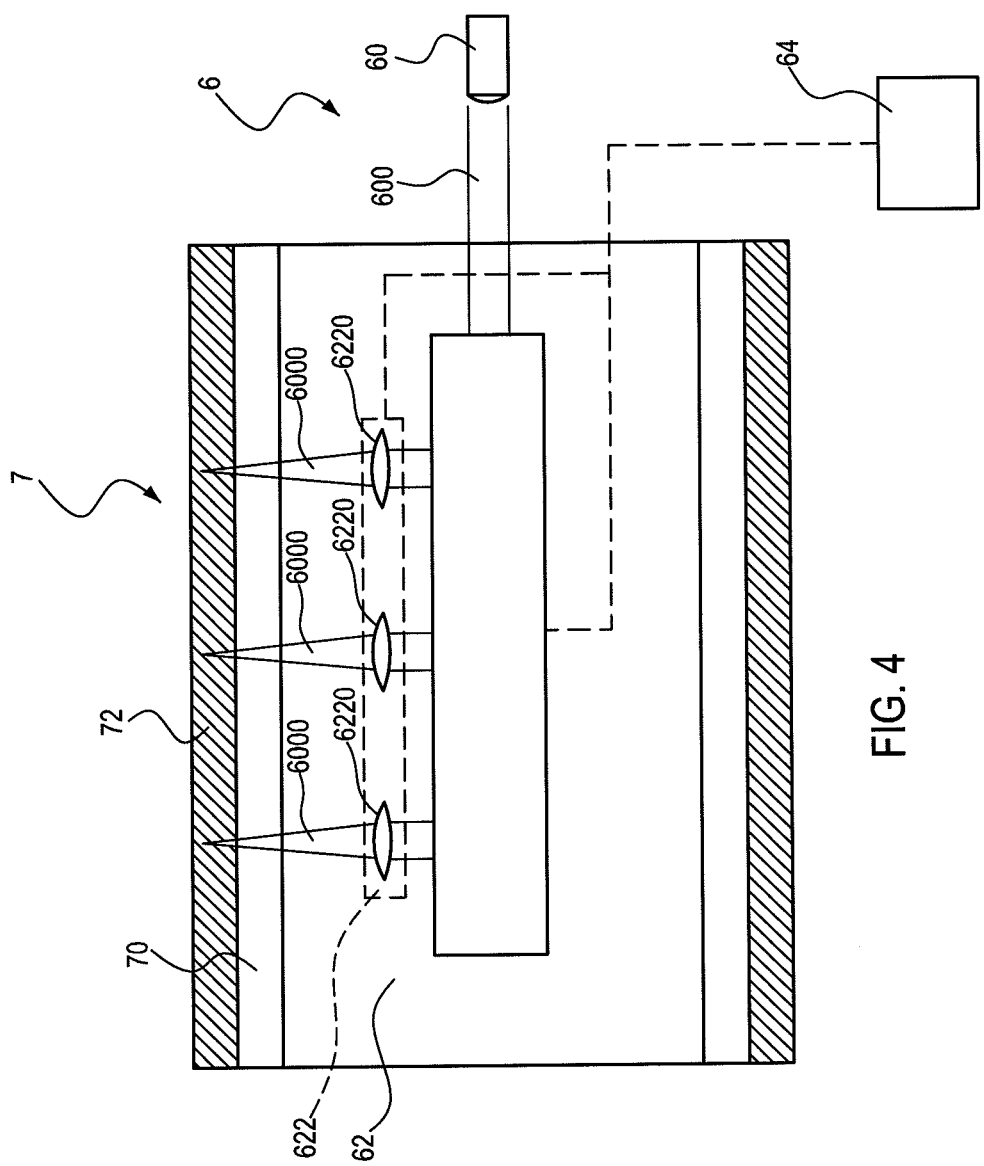
FIG. 4 is a schematic drawing of a mold making system according to another embodiment of the present invention.

FIG. 4 is a schematic drawing of a mold making system 6 according to another embodiment of the present invention. As shown in FIG. 4, the mold making system 6 includes a laser generation device 60, an optical path changing device 62, and a control device 64. The control device 64 is connected to the optical path changing device 62. The mold making system 6 is used in a roller mold 7 for patterning a surface of the roller mold 7.

A difference between this embodiment and the above embodiments lies in that the optical path changing device 62 in this embodiment further includes a light splitting unit 620 and a focusing unit 622. The focusing unit 622 further includes a plurality of focusing mirrors 6220. In this embodiment, the focusing unit 622 includes three focusing mirrors 6220. However, in practice, the number of the focusing mirrors 6220 is not limited in the present invention, but depends on the demands of the users or designers. In addition, other units in the mold making system 6 and roller mold 7 in this embodiment are basically the same as corresponding units in the above embodiments, the description of which is omitted here.

In this embodiment, both the light splitting unit 620 and the focusing unit 622 are connected to the control device 64 to be controlled by the control device 64. When the laser generation device 60 generates an ultrafast laser 600 to the optical path change device 62, the control device 60 controls the light splitting unit 620 to split the ultrafast laser 600 into three first ultrafast lasers 6000 to all the focusing mirrors 6220 of the focusing unit 622. Next, the focusing mirrors 6220 focus the first ultrafast lasers 6000 to different positions in the polymer layer 72. The control device 64 controls the position of each focusing mirror 6220, and at the same time controls the light splitting unit 620 to emit the split first ultrafast lasers 6000 to the focusing mirrors 6220 respectively. It should be noted that, in practice, the control device controls the number of the first ultrafast lasers split by the light splitting unit according to the number of the focusing mirrors. Therefore, the control device controls the optical path changing device to generate multiple optical paths to scan the polymer layer synchronously, so as to solve the time consuming problem in the scanning processing.

Figure 5:
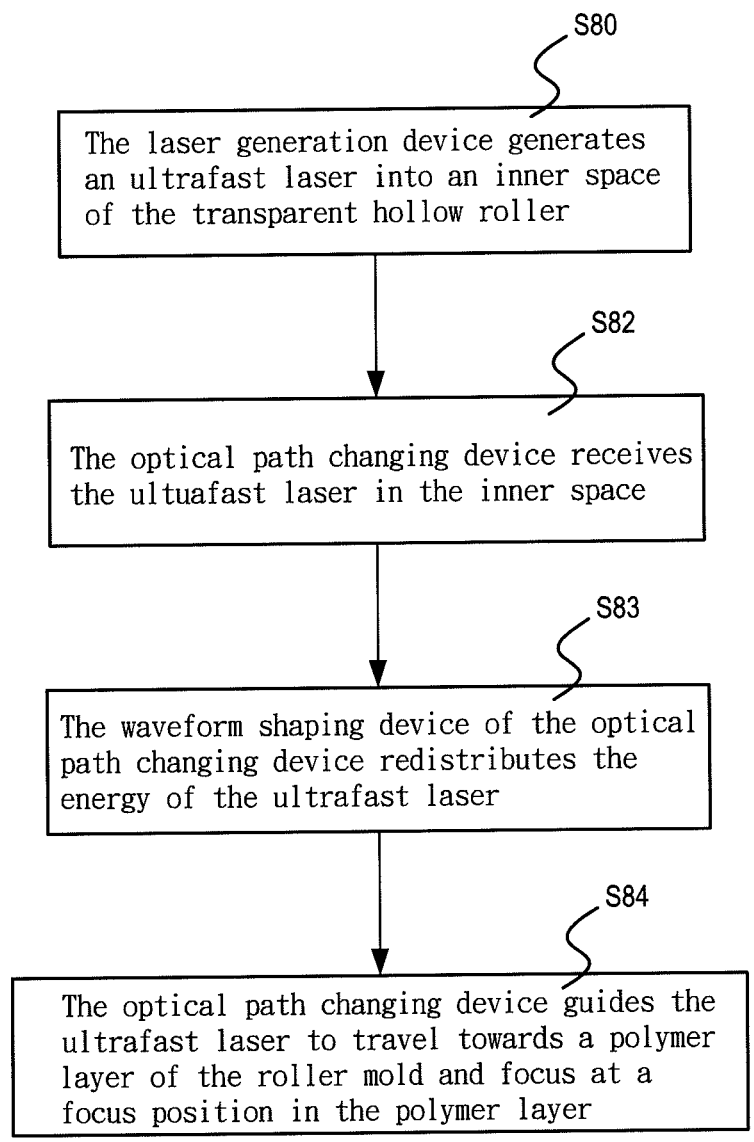
FIG. 5 is a flow chart of steps of a mold making method according to an embodiment of the present invention.

Referring to FIG. 5 in combination with FIG. 1, FIG. 5 is a flow chart of steps of a mold making method according to an embodiment of the present invention. As shown in FIG. 5, the mold making method in this embodiment includes the following steps. In Step S80, the laser generation device 10 generates an ultrafast laser 100 into an inner space of the transparent hollow roller 20. In Step S82, the optical path changing device 12 receives the ultrafast laser 100 in the inner space. In Step S84, the optical path changing device 12 guides the ultrafast laser 100 to travel towards a polymer layer 22 of the roller mold 2 and to be focused at a focus position in the polymer layer 22. It should be noted that the position where the optical path changing device 12 guides the ultrafast laser 100 to be focused can be changed according to demands.

The above steps can be controlled by a control center, for example, the control device 14 of the mold making system 1 in FIG. 1. The control center controls the optical path changing device to guide the ultrafast laser to be focused in the polymer layer according to control information (for example, contour analysis of the micro/nanometer 3D structure). Two-photon absorption occurs on the polymer material where the ultrafast laser is focused, so as to cause a photopolymerization effect on the polymer material, so that the polymer material is cured. Next, parts of the polymer layer that are not cured are removed to form a 3D structure. Thus, the patterning of the surface of the roller mold can be realized.

In addition, referring to FIGS. 5 and 2, in this embodiment, the mold making method further includes the following steps. In Step S83, the waveform shaping device 320 of the optical path changing device 32 redistributes the energy of the ultrafast laser 300. In Step S83, the beam of the ultrafast laser 300 has a leveling effect.

Figure 6:
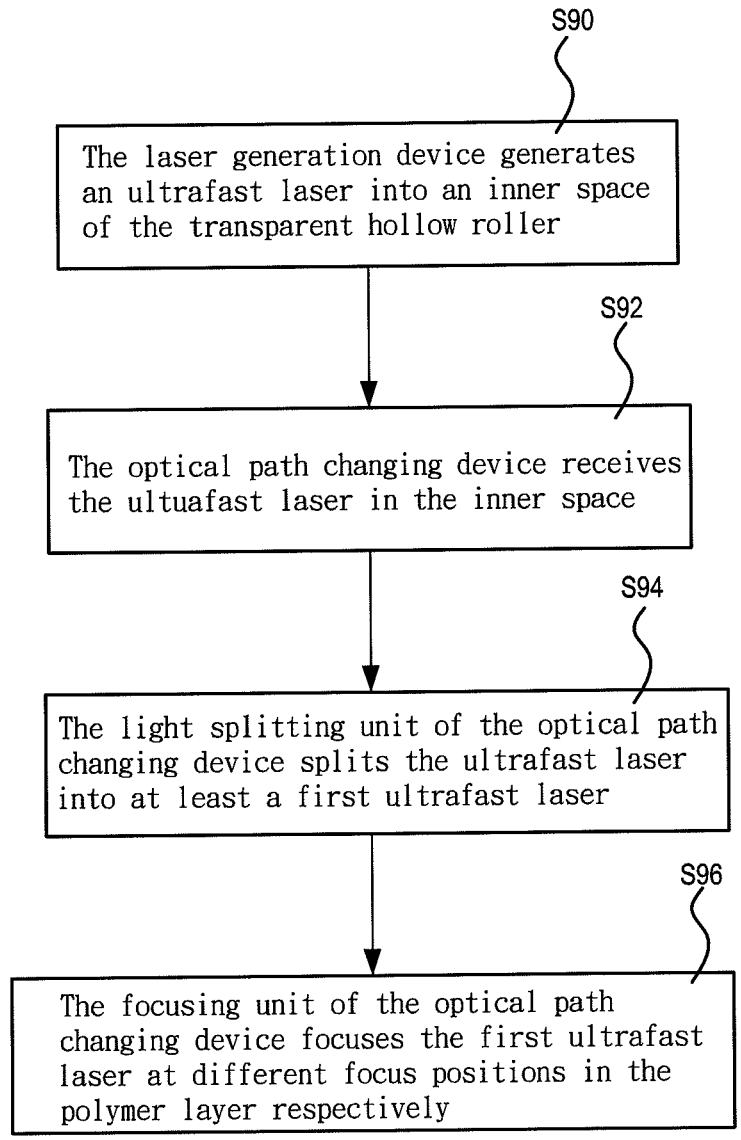
FIG. 6 is a flow chart of steps of a mold making method according to another embodiment of the present invention.

Referring to FIGS. 6 and 4, FIG. 6 is a flow chart of steps of a mold making method according to another embodiment of the present invention. As shown in FIG. 6, the mold making method in this embodiment includes the following steps. In Step S90, the laser generation device 60 generates an ultrafast laser 600 into an inner space of the transparent hollow roller 70. In Step S92, the optical path changing device 62 receives the ultrafast laser 600 in the inner space. In Step S94, the light splitting unit 620 of the optical path changing device 62 splits the ultrafast laser 600 into at least one first ultrafast laser 6000 (as shown in FIG. 4, the ultrafast laser 600 in FIG. 4 is split into three first ultrafast lasers 6000). In Step S96, the focusing unit 622 of the optical path changing device 62 focuses the first ultrafast laser 6000 at different focus positions in the polymer layer 72, respectively.

In this embodiment, in Steps S94 and S96, the ultrafast laser that is originally a single beam is split into a plurality of first ultrafast lasers which are focused at different positions in the polymer layer, respectively. Therefore, the mold making method can process the polymer layer synchronously through a plurality of optical paths, so that the time consuming problem of the scanning processing is solved.

In conclusion, in the mold making system according to the present invention, the ultrafast laser is irradiated into the inner space of the roller mold, and the optical path changing device disposed in the inner space emits and focuses the ultrafast lasers, respectively. The ultrafast lasers emitted outwards from the inner space pass through the transparent roller and are focused at the polymer layer on the outer surface of the roller. Two-photon absorption occurs on the polymer layer at the focus points of the ultrafast laser, thus resulting in a photopolymerization phenomenon. Therefore, the polymer layer on the roller mold is patterned. Compared with the prior art, the mold making system and method of the present invention can be used for making a precise 3D micro/nanometer structure for a roller mold, and at the same time, the mold making system and method have characteristics such as low power consumption and fast processing, thus the problem of thermal diffusion in the conventional laser processing can be avoided.

The detailed illustration of the embodiments above is intend to describe the features and spirits of the present invention more clearly, rather than to limit the scope of the present invention with the embodiments as disclosed above. On the contrary, the objective is to cover various changes and equivalent arrangements within the scope of the claims of the present invention. Therefore, the scope of the claims of the present invention should be construed in the widest scope according to the above illustration, so as to cover all possible changes and equivalent arrangements.

What is claimed is:

1. A mold making system, used for patterning a surface of a roller mold, wherein the roller mold comprises a transparent hollow roller and a polymer layer, the polymer layer is disposed on an outer surface of the transparent hollow roller, and the mold making system comprises:
- a laser generation device, used for generating an ultrafast laser;
- an optical path changing device, disposed in an inner space of the transparent hollow roller, and used for receiving the ultrafast laser; and
- a control device, connected to the optical path changing device;
- wherein the control device controls the optical path changing device to guide the ultrafast laser to travel towards the polymer layer of the roller mold and to be focused at a focus position in the polymer layer.

2. The mold making system according to claim 1, wherein a pulse period of the ultrafast laser is $5 \times 10^{-15}$ second.

3. The mold making system according to claim 1, wherein the optical path changing device further comprises:
- a light splitting unit, connected to the control device, and used for receiving the ultrafast laser and splitting the ultrafast laser to obtain at least one first ultrafast laser; and
- a focusing unit, connected to the control device, and used for receiving the at least one first ultrafast laser;
- wherein the control device controls the light splitting unit to receive the ultrafast laser and split the ultrafast laser to obtain at least one first ultrafast laser, and the control device controls the focusing unit to receive the at least one first ultrafast laser and guide the at least one first ultrafast laser to be focused at least one first focus position in the polymer layer, respectively.

4. The mold making system according to claim 1, wherein the control device controls the optical path changing device to guide the ultrafast laser to change the focus position according to control information.

5. The mold making system according to claim 1, wherein the optical path changing device further comprises a waveform shaping device used for redistributing energy of the ultrafast laser.

6. A mold making method, used for patterning a roller mold, wherein the roller mold comprises a transparent hollow roller and a polymer layer, the polymer layer is disposed at an outer surface of the transparent hollow roller, and the method comprises:
- emitting an ultrafast laser into an inner space of the transparent hollow roller;
- receiving the ultrafast laser in the inner space; and
- guiding the ultrafast laser to travel towards the polymer layer of the roller mold and to be focused at a focus position in the polymer layer.

7. The method according to claim 6, further comprising:
- receiving the ultrafast laser in the inner space, and splitting the ultrafast laser into at least one first ultrafast laser; and
- guiding the at least one first ultrafast laser to be focused at least one first focus position in the polymer layer, respectively.

8. The method according to claim 6, wherein a pulse period of the ultrafast laser is $5 \times 10^{-15}$ second.

9. The method according to claim 6, further comprising:
- controlling the optical path changing device to guide the ultrafast laser to change the focus position according to control information.

10. The method according to claim 6, further comprising:
- redistributing energy of the ultrafast laser by using a beam shaping device.

* * * * *